United States Patent [19]
Chanteau et al.

[11] Patent Number: 6,020,911
[45] Date of Patent: Feb. 1, 2000

[54] FILTERING DEVICE FOR TREATING A PLURALITY OF CHANNELS IN A TELEVISION SIGNAL CABLE DISTRIBUTION SYSTEM

[75] Inventors: Pierre Chanteau, La Haye Malherbe; Yannick Deville, Villecresnes; Paul Friedel, Louviers, all of France

[73] Assignee: U.S. Philips Corporation, New York, N.Y.

[21] Appl. No.: 08/741,164

[22] Filed: Oct. 29, 1996

[30] Foreign Application Priority Data

Oct. 31, 1995 [FR] France .................................. 95 12866

[51] Int. Cl.$^7$ .............................. H04N 7/10; H04H 1/00; H04H 1/02
[52] U.S. Cl. ................................ 348/6; 455/3.1; 455/6.1; 455/339; 327/557; 333/17.1
[58] Field of Search ................................ 348/6; 327/553, 327/557; 333/235, 231, 223, 205, 209, 126, 129, 132, 134, 17.1; 455/339, 340, 3.1, 6.1; H04N 7/10; H04B 1/16; H04H 1/00, 1/02

[56] References Cited

U.S. PATENT DOCUMENTS

| | | | |
|---|---|---|---|
| 4,980,882 | 12/1990 | Baer et al. | 369/275.3 |
| 5,300,838 | 4/1994 | Elizondo | 455/314 |
| 5,317,461 | 5/1994 | Okamoto et al. | 327/557 |
| 5,550,520 | 8/1996 | Kobayashi | 333/213 |
| 5,561,394 | 10/1996 | Hagino | 327/557 |

*Primary Examiner*—Andrew I. Faile
*Assistant Examiner*—Vivek Srivastava
*Attorney, Agent, or Firm*—Leroy Eason

[57] ABSTRACT

A filter for treating a plurality of channels in a television signal cable distribution system comprises a plurality of paralel bandpass filters having a frequency which is individually controlled by frequency control voltages. A master filter provided with a filtering cell of a type identical to that used in a bandpass filter corresponds to each bandpass filter. For adjusting the central frequency of a master filter, a frequency is applied thereto by a frequency synthesizer and the cell is aligned with this frequency by acting on its frequency control voltage. This voltage is simultaneously applied to a bandpass filter for controlling the frequency, which is thus aligned with the frequency of the synthesizer simultaneously with that of the corresponding master filter. Each couple consisting of a bandpass filter and a corresponding master filter is realized by means of integration on the same semiconductor substrate (IC).

9 Claims, 4 Drawing Sheets

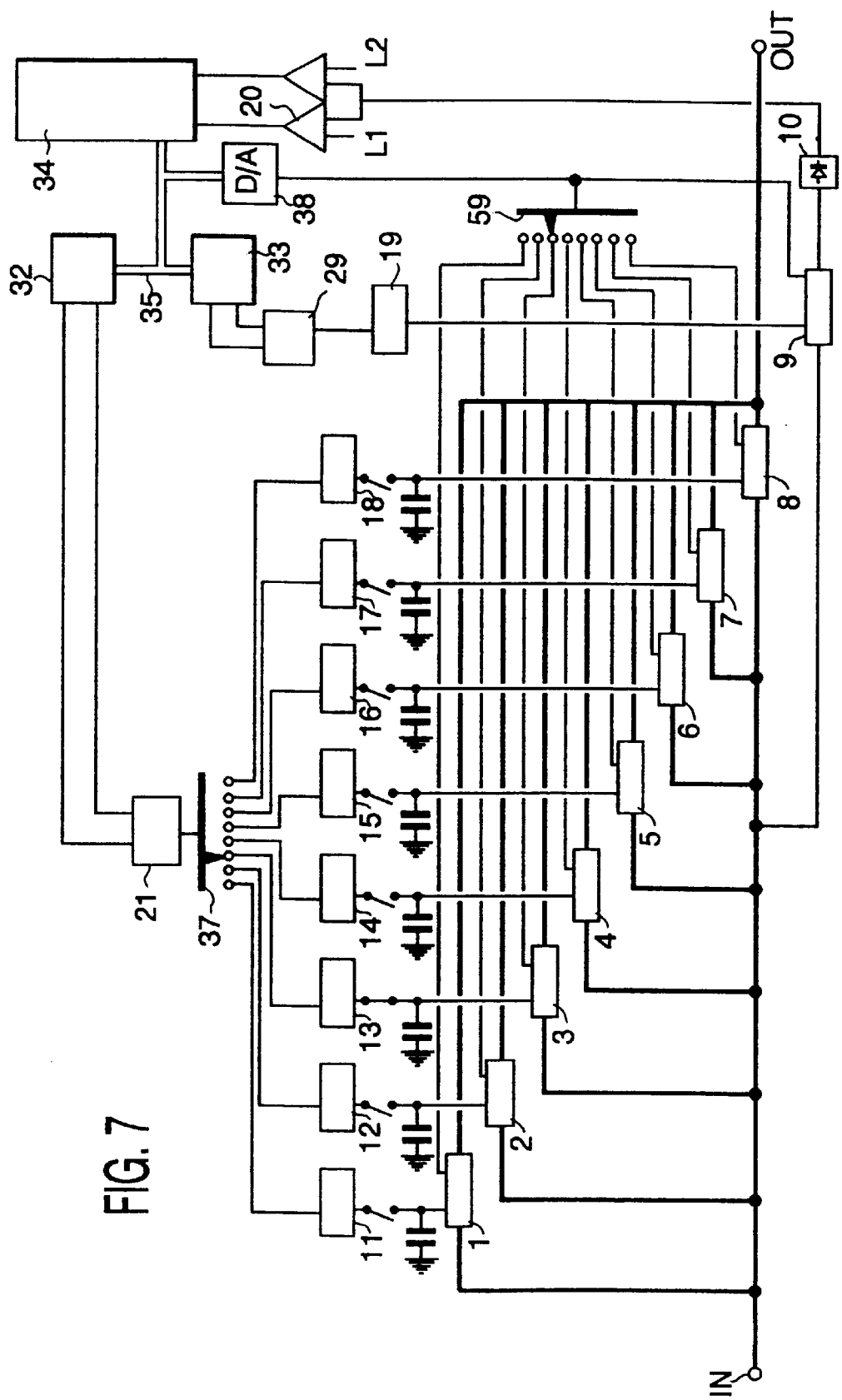

FILTERING DEVICE FOR TREATING A PLURALITY OF CHANNELS IN A TELEVISION SIGNAL CABLE DISTRIBUTION SYSTEM

BACKGROUND OF THE INVENTION

1. Field of the Invention

The invention relates to a filtering device for individually treating a plurality of channels in a television signal cable distribution system, comprising a plurality of parallel paths each provided with a bandpass filter having a central frequency which is controlled by a voltage applied to a frequency control input.

The invention also relates to a collective television signal distribution system.

2. Description of Related Art

Filtering devices as described in the opening paragraph are marketed by several manufacturers. The most sophisticated devices comprise filters having frequencies which are determined by variable capacitance diodes set one by one for each filter during manufacture, while the control voltage values of these variable capacitance diodes are stored for each variable capacitance diode and for each frequency. The installation is thus easy because it is sufficient for an engineer to recall a stored value for obtaining the desired control. Nevertheless, when the system ages, the necessary voltages are susceptible of varying with time, and the system gets out of order.

SUMMARY OF THE INVENTION

It is an object of the invention to provide a collective television signal distribution system which can be manufactured in an economical manner and does not deviate when it ages.

To this end, a master filter corresponds to each bandpass filter of a filtering device, which master filter is provided with a filtering cell of a type identical to that used in a bandpass filter and with servocontrol means for aligning, by means of a frequency control voltage, the central frequency of this cell with the frequency of a signal supplied by a frequency synthesizer, and, for aligning the frequency of the corresponding bandpass filter, said control voltage is simultaneously applied to the frequency control input of this bandpass filter, while each couple consisting of a bandpass filter and a corresponding master filter is realized by means of integration on the same semiconductor substrate.

A bandpass filter is thus each time a "slave" of its own master filter. The invention thus uses several elements of the device in common, with common control means, which is made possible by the fact that various elements of the same type have quasi-identical characteristics.

In a particular embodiment, the means for servocontrol of the central frequency of a master filter are constituted by a circuit for measuring the phase difference between the input and the output of the filtering cell of the master filter, said circuit applying an error signal to a frequency control voltage input of the cell of the master filter and to that of the bandpass filter, which error signal corresponds to the difference between the measured phase difference and the desired phase difference.

The definition of the central frequency of a filter may thus be obtained with a minimum of means.

A frequency synthesizer being composed of a variable frequency oscillator and a PLL feedback circuit in which a frequency is defined and which generates a voltage for tuning the oscillator, the device preferably comprises as many oscillators as bandpass filters but a single PLL circuit which is common for the plurality of bandpass filters, while switching means are provided for selecting the different oscillators in turns by applying the signal from the selected oscillator to the PLL circuit and applying to this oscillator the tuning voltage from the PLL circuit, as well as means for adjusting the frequency defined by the PLL circuit at the frequency desired for the selected oscillator, and a provisional storage means for each oscillator for storing the value of the tuning voltage during periods when said oscillator is not selected.

The use of multiple PLL circuits is thus avoided.

The provisional storage means for each oscillator is advantageously constituted essentially by a storage capacitor.

Such a means is economical and simple.

Advantageously, a filtering cell is of the resistance-capacitance type, in which the tuning resistances are constituted by field effect transistors.

The central frequency control of a filter may thus be obtained easily by means of a voltage.

Based on filtering cells which are similar to each other, a bandpass filter is advantageously constituted by several cells, while a master filter comprises a single cell.

The master filter is thus more economical without affecting the performance.

The device comprising more than two paths, all the bandpass filters and all the master filters are advantageously realized by means of integration on the same semiconductor substrate.

The device is thus particularly economical.

Each bandpass filter being gain-controllable by means of a voltage applied to a gain control input, the device advantageously comprises a connection for taking a signal from the input of the filtering device, which connection is equipped with a specific filter associated with a specific master filter which are similar to a bandpass filter and a corresponding master filter, respectively, and is provided with means for adjusting the frequency of its filtering cell in turns at each of the central frequencies of the bandpass filters, the device also comprising a circuit for comparing the level of the signal at the output of the specific filter with a nominal value, means for servocontrol of the level of the output signal of the specific filter for bringing this level to said nominal value by means of the gain control input of the specific filter, switching means for supplying, in turns, the gain control voltage of the specific filter to one of the bandpass filters, while the frequency applied to the specific master filter corresponds to that desired for the bandpass filter, and provisional storage means for each bandpass filter for storing the value of the gain control voltage during the periods when the bandpass filter does not receive the gain control voltage of the specific filter.

The gain of all the paths may thus be controlled automatically and remains stable with respect to time.

A collective television signal distribution system advantageously comprises a filtering device according to the invention.

These and other aspects of the invention will be apparent from and elucidated with reference to the embodiments described hereinafter.

BRIEF DESCRIPTION OF THE DRAWINGS

In the drawings:

FIG. 7 is a diagram of an alternative of a filtering device.

DESCRIPTION OF THE PREFERRED EMBODIMENTS

The filtering device which will now be described is intended to individually treat a plurality of channels (for example UHF channels) in a television signal cable distribution system and comprises, inter alia, oscillators, bandpass filters and master filters, and one or more PLL circuits. A television signal in a filter will be referred to as UHF signal.

Figure 1:
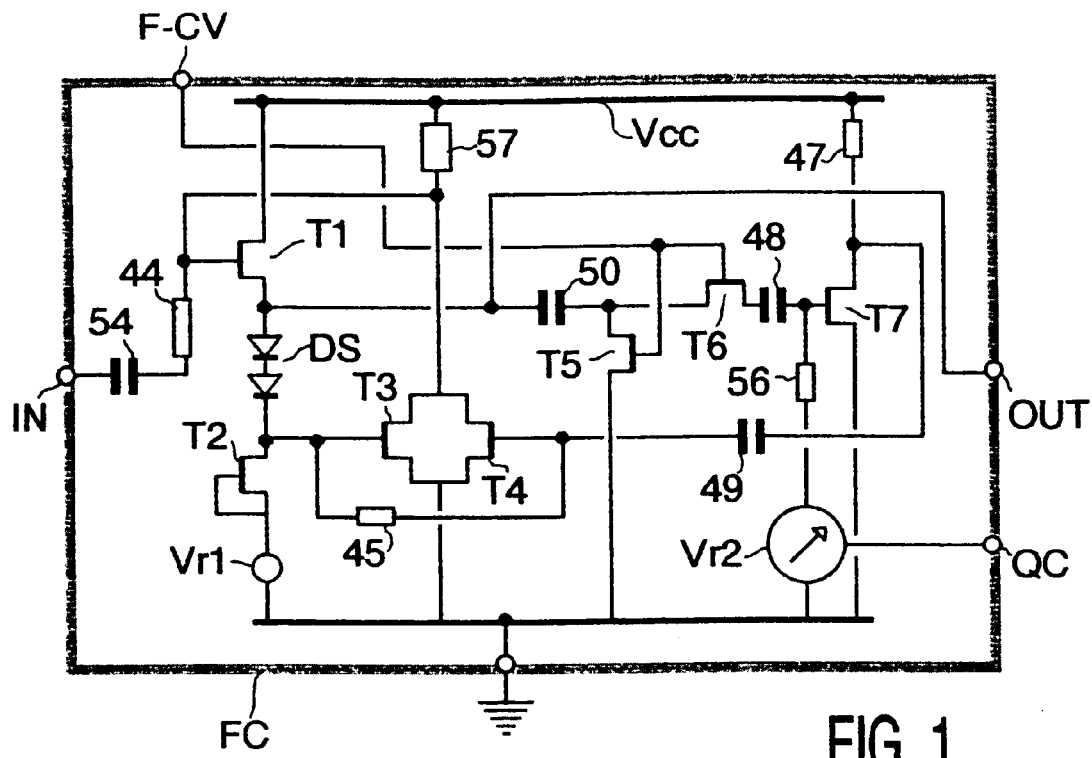
FIG. 1 is a diagram of a filtering cell of a bandpass filter.

An example of a filtering cell having a central frequency which is controlled by means of a frequency control voltage and being denoted by the reference FC in FIG. 1 comprises, in the path of the signal from the input IN, a connection capacitor 54 in series with a resistor 44, conveying the current of the UHF signal. Downstream of the resistor 44, the signal is applied to the gate of a field effect transistor T1, which is arranged in a source follower configuration (its drain is connected to a power supply source Vcc). The source of T1 is connected to a reference voltage Vr1 via one or more series-arranged diodes DS and a field effect transistor T2 whose gate is connected to the source. The signal at the source of T1 is applied to the source of a field effect transistor T7 via a filtering network constituted by a capacitance-resistance assembly and a resistance-capacitance assembly arranged in cascade. The capacitance-resistance assembly is constituted by a capacitor 50 and a field effect transistor T5 acting as a variable resistance. The resistance-capacitance assembly is constituted by a field effect transistor T6 acting as a variable resistance and by the input capacitance of the field effect transistor T7. The capacitor 48 is a connection capacitor.

The gate of the field effect transistor T7 is polarized by means of a resistor 56 connected to a reference voltage Vr2. The voltage of this source Vr2 may be adjusted by means of a voltage applied to an input QC for adjusting the Q-coefficient. By varying Vr2, the gain of transistor T7 can be adjusted and, consequently, the Q-coefficient, i.e. the bandwidth of the filtering cell. The field effect transistor T7 is charged by a resistor 47 and supplies an output signal at its drain. This signal is applied via a connection capacitor 49 to the gate of a field effect transistor T4, constituting one of the two inputs of a circuit having two inputs constituted by the two field effect transistors T4 and T3. The second input of the circuit of two inputs, constituted by the gate of the field effect transistor T3, is connected to the drain of T2 at which the same signal is present as at the source of the field effect transistor T1, but simply shifted by the diodes DS. The gate of T4 is connected to that of T3 via a resistor 45 for polarizing T4. The mean current of the circuit with two inputs T3-T4 is absorbed by a load resistor 57 connected to the power supply source Vcc. The terminal of the load resistor 57, which is connected to the drains of T3 and T4, is also connected to the gate of T1 and to the resistor 44. The characteristic frequency of the filtering network may be controlled because the field effect transistors T6 and T5 act as variable resistances in the filtering network, and the central frequency control of the filter is thus obtained by applying a frequency control voltage to a control voltage input F-CV, connected to the gates of the field effect transistors T5 and T6. The output signal of the filtering cell is taken from the source of T1 which is connected to the output OUT. The filter described above is one of several possible filter models; it will be evident that any known filter having a voltage-controllable frequency is also suitable.

Figure 2:
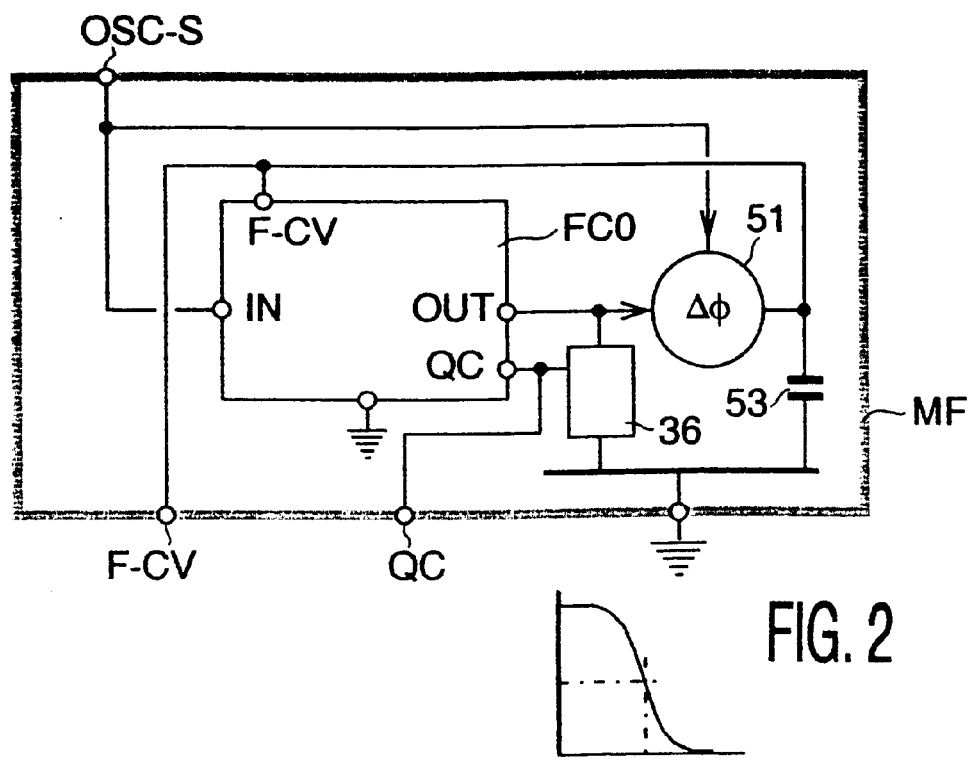
FIG. 2 shows diagrammatically a master filter.

A master filter provided with servocontrol means for aligning its central frequency with the frequency of a signal supplied by a frequency synthesizer and generating said frequency control voltage is denoted by MF in FIG. 2. It comprises a cell FCO exactly conform to the cell FC of FIG. 1. To facilitate the identification of various inputs or outputs with which cell FCO of FIG. 2 is provided, these inputs or outputs are placed in the same position on the outline of the cell as in the cell FC of FIG. 1. A signal from an oscillator OSC-S is applied to an input OSC-S of the master filter MF which is connected to the input IN of the cell FCO and also to an input of the phase comparator 51 having two inputs. The output OUT of the cell FCO is connected to the second input of the phase comparator 51 for comparing its signal with the signal OSC-S. The comparison signal, filtered by a capacitor 53, is applied to the control voltage input F-CV of the cell FCO in order to align its central frequency with the frequency OSC-S, and also to an output F-CV of the master filter MF itself so as to be available for controlling the frequency of the exterior filtering cells. Below FIG. 2, a curve represents the trend of the phase variation of the signal between the input and the output of the cell FCO as a function of the frequency: the point indicated by the crossing of the two dot and dash lines corresponds to the central frequency of the cell FCO. At this point, the phase varies very rapidly, with the consequence that the definition of a given phase ensures a precise frequency control. The comparator 51 is designed in such a way that a zero comparison signal is provided for the point in question.

Since the Q-coefficient of a filter varies with the frequency, it is useful to adjust the Q-coefficient. A device 36 is provided for this purpose, which is connected to the output OUT of the cell FCO in order to measure the output level of the cell FCO and to realize a servocontrol of this output level by known means by applying an adequate voltage to the input QC of the cell FCO. This input QC is connected to an output QC of the master filter MF for adjusting the Q-coefficient of a slave bandpass filter.

Figure 3:
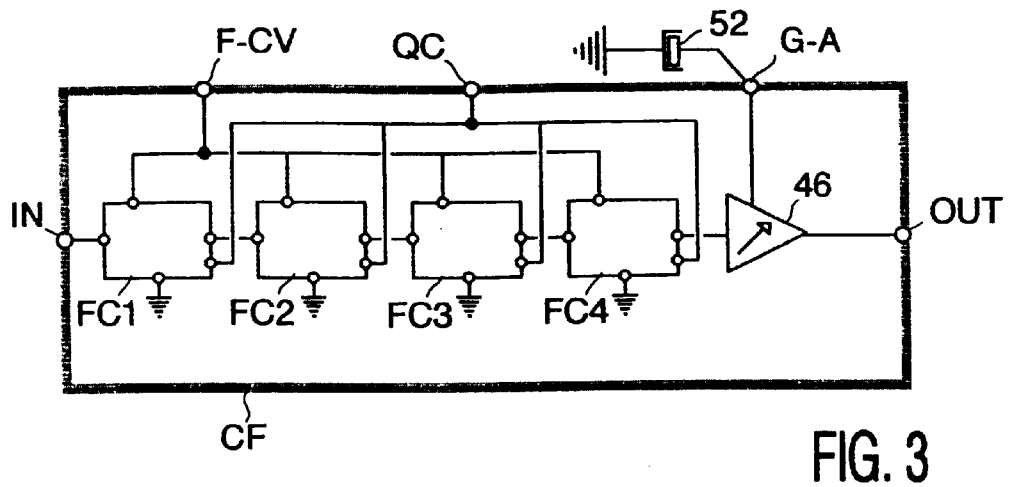
FIG. 3 shows diagrammatically a bandpass filter.

A bandpass filter, or slave filter, denoted by the reference CF in FIG. 3 comprises a cascade arrangement of several cells of the type shown in FIG. 1. Several cells are necessary for obtaining the searched selectivity, while a single cell is sufficient in the master filter of FIG. 2 where the selectivity is less important because the function of the master cell is only to provide the frequency control signal F-CV. Here, four cells FC1, FC2, FC3, FC4 are provided. To facilitate the identification of the various inputs or outputs of the cells FC1 to FC4 of FIG. 3, their inputs or outputs are placed in the same position on the outline of the cell as in the cell FC of FIG. 1. The frequency control inputs of each cell are connected for their frequency control to the frequency control input F-CV of the complete filter. For the sake of simplicity, one common connection between the input F-CV and the control inputs of each filtering cell is shown; an appropriate shift from one cell to the other could also be introduced, for example by means of resistive voltage dividers (not shown) in order that the frequencies are slightly shifted to obtain a larger bandwidth by addition of the filtering operations by the cells. Arranged in cascade with the cell FC4 is a controllable gain amplifier 46 having a gain control input which is connected to a gain control voltage input G-A of the filter CF, the voltage of which is stored by a storage capacitor 52. This amplifier 46 may also be arranged at the input IN or between two cells, the better position depending on the desired performance, by realizing a compromise between the signal-to-noise ratio and the distortion. An input QC for adjusting the Q-coefficient is connected to the Q-coefficient adjusting inputs of each cell FC1 to FC4.

Figure 4:
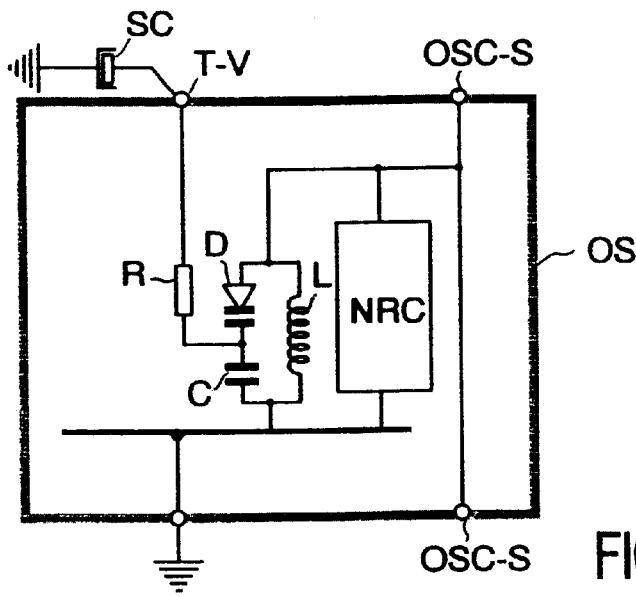
FIG. 4 is a diagram of an oscillator.

A variable frequency oscillator, referenced OS in FIG. 4, has a resonant circuit comprising an inductance L and a capacitance constituted by a capacitor C in series with a variable capacitance diode D. A tuning voltage is applied to an input T-V which is connected to the cathode of the diode D via a resistor R. This tuning voltage is stored in a storage capacitor SC, storing its value during the periods when the oscillator is not selected, i.e. during the period when its input T-V is not connected to a tuning voltage.

An oscillation is maintained in the resonant circuit by means of an active circuit NRC which can be assimilated with a negative resistance, which is not shown in detail but which those skilled in the art can choose from many known types (for example Hartley, Colpitts, Clapp, etc.). The UHF signal of the oscillator is applied to outputs OSC-S.

Figure 5:
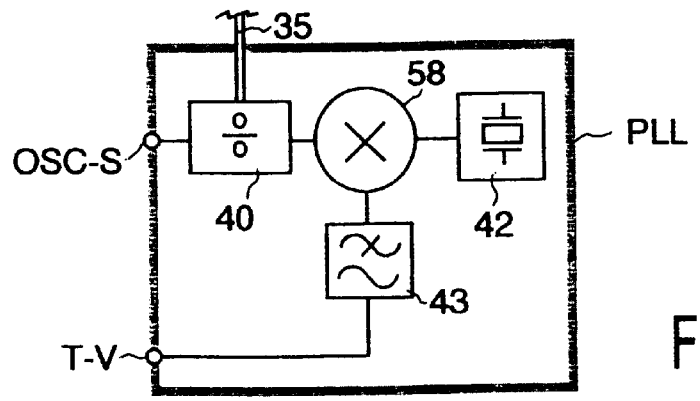
FIG. 5 shows diagrammatically a PLL circuit.

A PLL circuit (FIG. 5), in which a frequency is defined by a frequency divider, has an input OSC-S for a signal from an oscillator, for example an oscillator of the type shown in FIG. 4. The signal from this input OSC-S is applied to the input of a frequency divider 40 having a division ratio which is programmed by a processor to which the frequency divider 40 is connected via a bus 35. The signal of the divided frequency is applied to an input of a phase comparator 58 having two inputs. The signal from a known quartz oscillator 42 is applied to the second input of the comparator 58. The error signal at the output of the comparator is filtered in a known low-pass filter 43 and applied to a tuning voltage output terminal T-V for tuning the oscillator whose signal UHF is applied to the input OSC-S of the PLL circuit.

An embodiment of the complete filtering device (FIG. 6) comprises different units, most of which have been described hereinbefore with reference to FIGS. 1 to 5. To facilitate the identification of the various inputs or outputs with which each of these units is provided, these inputs or outputs are placed in FIG. 6 in the same position on their outline as in FIGS. 1 to 5. To simplify the Figure, the ground connections are not shown. The signal is filtered between an input IN and an output OUT. Between the input IN and the output OUT, the device has eight parallel paths each provided with a slave bandpass filter, similar to that of FIG. 3, and denoted by the reference numerals 1 to 8, having a central frequency which is controlled by means of a frequency control voltage applied to an input shown in the Figure at the top left of each filter. A master filter denoted by the reference numerals 11 to 18 corresponds to each slave filter 1–8. Each master filter is similar to that in FIG. 2 and is connected to an oscillator 21 to 28, respectively, similar to that of FIG. 4. The central frequency of each master filter 11 to 18 is aligned with the frequency of the signal supplied by the oscillator 21 to 28, respectively. A multiple frequency synthesizer is constituted by each oscillator in connection with a sole PLL circuit 32. A switch 30, which is activated by a processor 34, in turn connects the output signal (output OSC-S of FIG. 4) of each of the oscillators 21–28 to the signal at the input (input OSC-S of FIG. 5) of the PLL circuit 32 in the rhythm of a known clock (not shown). In a corresponding manner, a switch 31, which is activated by the processor 34, in turn connects the tuning voltage output terminal (T-V in FIG. 5) of the PLL circuit 32 to tuning inputs (T-V in FIG. 4) of each oscillator. The processor 34 is programmed to introduce the data on a bus 35 so as to program the desired division ratio of the divider in the PLL circuit 32 and to obtain the desired frequency for the oscillator which is selected by the switches 30 and 31. An address bus, which is not shown so as to simplify the Figure, allows designation at each instant of the relevant element which is concerned by the data. To control the frequency of a slave filter 1-8 simultaneously with that of the corresponding master filter 11-18, a frequency control voltage input of a slave filter (input F-CV of FIG. 3) is each time connected to a frequency control voltage output of the corresponding master filter (output F-CV of FIG. 2) and, for adjusting the Q-coefficient of a slave filter 1-8 simultaneously with that of the corresponding master filter 11-18, a voltage input for adjusting the Q-coefficient of a slave filter (input QC in FIG. 3) is connected each time to the voltage output for adjusting the Q-efficient of the corresponding master filter (output QC in FIG. 2). All the pairs consisting of a slave filter and a corresponding master filter are realized by means of integration on the same semiconductor substrate which is shown within the broken lines denoted by IC. Alternatively, each pair may also be realized on a separate substrate. Thus, the switch 30 is conveying quasi DC voltages, and the switch 31 is conveying RF signals.

The device also has a connection for tapping the signal, provided with a specific filter 9 which is connected to the input IN of the filtering device. The specific filter 9 is associated with a specific master filter 19. The filters 9 and 19 are similar to a slave filter and a master filter, respectively. The specific master filter 19 is provided with means for servocontrolling the central frequency of its filtering cell by alignment with the frequency of a signal provided by a second frequency synthesizer which is constituted by an oscillator 29 and a PLL circuit 33. On the bus 35, the processor 34 supplies data for adjusting the frequency defined by the PLL circuit 33 in turn at each of the central frequencies desired for the bandpass filters. A circuit for comparing the level of the signal at the output of the specific filter 9 is constituted by a detector element 10 providing a voltage which is proportional to the level of the signal at the output of the filter 9, and by means for comparing this voltage with a nominal value, which means are constituted by two comparators having two inputs, denoted by the reference numeral 20, which compare the signal at the output of the specific filter 9 with two reference levels L1 and L2, respectively, and communicate the result of the comparison to the processor 34 which computes a gain control voltage value of the specific filter and supplies it to a D/A converter 38 which applies it to the gain control input of the specific filter 9. A switch 59, activated by the processor 34, in turn supplies the gain control voltage of the specific filter 9 to each bandpass filter 1 to 18, when the frequency of the oscillator 29 corresponds to that desired for the bandpass filter. As has been explained hereinbefore, this control voltage is stored for each bandpass filter.

Alternatively, the comparator 20 may act directly on the specific filter 9 by known analog means without going through the microprocessor (34) and a D/A conversion (38). The detector element 10 may be integrated in the substrate IC. The elements 29 and 33 may also be dispensed with. The specific master filter 19 would then be connected in turn to each oscillator 21 to 28 by means of a supplementary switch, in the same rhythm as for the switches 30 and 31. However, it is not certain whether a supplementary switch would not be more costly than the elements 29 and 33 which are thus economized.

Figure 6:
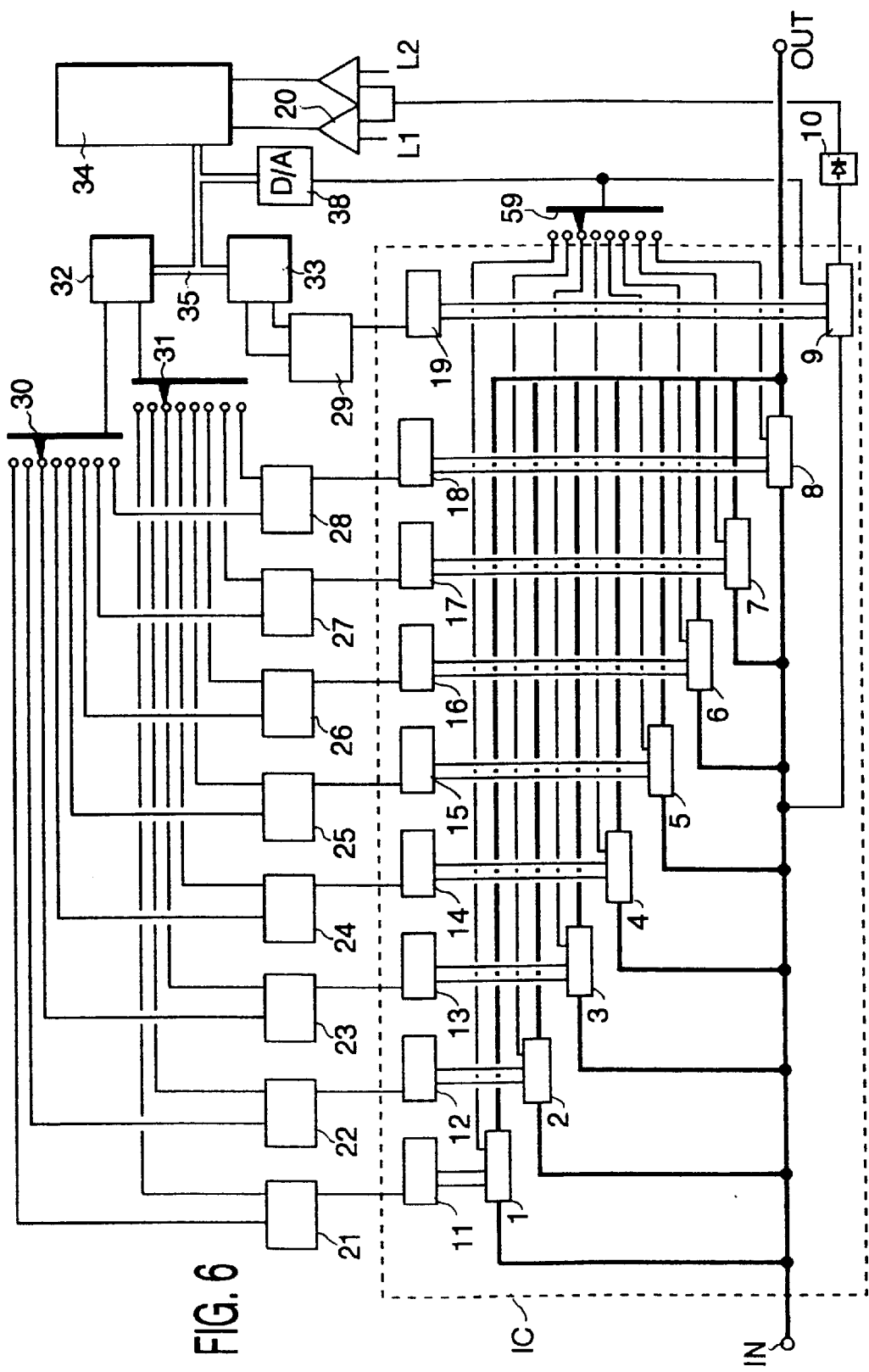
FIG. 6 is a diagram of a filtering device.

Another embodiment of the complete filtering device, shown in FIG. 7, comprises the same elements as the embodiment in FIG. 6, except for the oscillators 22 to 28. In their place, it comprises a single oscillator 21 whose UHF signal output (OSC-S, FIG. 4) is connected in turns to different UHF signal inputs (OSC-S, FIG. 2) of the different master filters 11 to 18 by means of a switch 37. The frequency control voltage of each of these master filters is applied to the corresponding slave filter by means of eight switches inserted each time in the connection connecting a slave filter to a master filter, only during the periods when the UHF signal output of the oscillator 21 is connected to the corresponding master filter. To store the frequency control voltage of each slave filter, a capacitance, shown each time below the reference numerals 1 to 18 of the corresponding master filters, is connected to the frequency control input of each slave filter. If this capacitance were important, it would not be integrated on the same substrate as the filters, which would necessitate the use of eight supplementary output terminals for connecting them to the exterior. Nevertheless, as the voltage F-CV is applied (cf. FIG. 1) to gates of the field effect transistors which have a current consumption of approximately zero, the capacitances in question may have a low value and may be integrated.

We claim:

1. A filtering device for individually treating a plurality of channels in a television signal cable distribution system, comprising: a plurality of parallel paths each provided with a bandpass filter having a central frequency which is controlled by a voltage applied to a frequency control input, characterized in that a master filter corresponds to each bandpass filter of the filtering device, said master filter including a filtering cell of a type identical to that used in a bandpass filter and with servocontrol means for aligning, by means of a frequency control voltage, the central frequency of said cell with the frequency of a signal supplied by a frequency synthesizer, and, for aligning the frequency of the corresponding bandpass filter, said control voltage is simultaneously applied to the frequency control input of said bandpass filter, while each couple including a bandpass filter and a corresponding master filter is realized by means of integration on the same semiconductor substrate.

2. A filtering device as claimed in claim 1, wherein the means for servocontrol of the central frequency of a master filter are comprise a circuit for measuring the phase difference between the input and the output of the filtering cell of the master filter, said circuit applying an error signal to a frequency control voltage input of the cell of the master filter and to that of the bandpass filter, said error signal corresponds to the difference between the measured phase difference and the desired phase difference.

3. A filtering device as claimed in claim 1, wherein, a frequency synthesizer comprises a variable frequency oscillator and a PLL feedback circuit in which a frequency is defined and which generates a voltage for tuning the oscillator, the device comprises as many oscillators as bandpass filters but a single PLL circuit which is common to the plurality of bandpass filters, switching means for selecting the different oscillators in turn by applying a signal from the selected oscillator to the PLL circuit and applying to said oscillator the tuning voltage from the PLL circuit, means for adjusting the frequency defined by the PLL circuit at the frequency desired for the selected oscillator, and a provisional storage means for each oscillator for storing the value of the tuning voltage during periods when said oscillator is not selected.

4. A filtering device as claimed in claim 3, wherein said provisional storage means for each oscillator comprises a storage capacitor.

5. A filtering device as claimed in claim 1, wherein, based on filtering cells which are similar to each other, a bandpass filter is comprises several cells, while a master filter comprises a single cell.

6. A filtering device as claimed in claim 1, wherein a filtering cell is of the resistance-capacitance type, wherein the tuning resistances comprise by field effect transistors.

7. A filtering device as claimed in claim 1, wherein the device comprises more than two paths, and all of the bandpass filters and all of the master filters are realized by means of integration on the same semiconductor substrate.

8. A filtering device as claimed in claim 1, in which each bandpass filter is gain-controllable by means of a voltage applied to a gain control input, and the device comprises a connection for taking a signal from the input of the filtering device, said connection including a specific filter associated with a specific master filter which is similar to a bandpass filter and a corresponding master filter, respectively, and means for adjusting the frequency of its filtering cell in turn at each of the central frequencies of the bandpass filters, the device also comprising a circuit for comparing the level of the signal at the output of the specific filter with a nominal value, means for servocontrol of the level of the output signal of the specific filter for bringing this level to said nominal value by means of the gain control input of the specific filter, switching means for supplying, in turns, the gain control voltage of the specific filter to one of the bandpass filters, while the frequency applied to the specific master filter corresponds to that desired for the bandpass filter, and provisional storage means for each bandpass filter for storing the value of the gain control voltage during periods when the bandpass filter does not receive the gain control voltage of the specific filter.

9. A collective television signal distribution system, wherein the system comprises a filtering device as claimed in claim 1.

* * * * *